(12) United States Patent
Kim

(10) Patent No.: US 9,343,229 B2
(45) Date of Patent: May 17, 2016

(54) MULTILAYER CERAMIC CAPACITOR AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventor: Tae Hyeok Kim, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 114 days.

(21) Appl. No.: 14/248,142

(22) Filed: Apr. 8, 2014

(65) Prior Publication Data

US 2015/0021073 A1 Jan. 22, 2015

(30) Foreign Application Priority Data

Jul. 22, 2013 (KR) .......................... 10-2013-0086319

(51) Int. Cl.
*H01G 4/30* (2006.01)
*H01G 2/06* (2006.01)
*H01G 4/12* (2006.01)
*H01G 4/012* (2006.01)
*H05K 1/18* (2006.01)
*H05K 3/34* (2006.01)

(52) U.S. Cl.
CPC .............. *H01G 2/065* (2013.01); *H01G 4/012* (2013.01); *H01G 4/12* (2013.01); *H01G 4/30* (2013.01); *H05K 1/181* (2013.01); *H05K 3/3442* (2013.01); *H05K 2201/10015* (2013.01); *H05K 2201/10636* (2013.01); *H05K 2201/2045* (2013.01); *Y02P 70/611* (2015.11)

(58) Field of Classification Search
CPC ........................................................ H01G 4/30
See application file for complete search history.

(56) References Cited

U.S. PATENT DOCUMENTS

| 4,312,026 | A | * | 1/1982 | Iwaya | ................... | H01G 4/06 |
| | | | | | | 361/308.1 |
| 5,985,414 | A | | 11/1999 | Fukuda et al. | | |
| 7,161,795 | B1 | * | 1/2007 | Megherhi | .............. | C04B 35/462 |
| | | | | | | 156/89.12 |
| 7,170,737 | B2 | † | 1/2007 | MacNeal | | |
| 7,463,474 | B2 | † | 12/2008 | Ritter | | |
| 2006/0158827 | A1 | | 7/2006 | Lee et al. | | |
| 2011/0090665 | A1 | † | 4/2011 | Korony et al. | | |
| 2012/0194031 | A1 | | 8/2012 | Ogawa et al. | | |

FOREIGN PATENT DOCUMENTS

| JP | 10-92691 A | 4/1998 |
| JP | 2006-203165 A | 8/2006 |

(Continued)

*Primary Examiner* — Dion R Ferguson
(74) *Attorney, Agent, or Firm* — McDermott Will & Emery LLP

(57) ABSTRACT

A multilayer ceramic capacitor may include: a ceramic body in which dielectric layers having an average thickness of 0.2 μm to 2.0 μm are stacked; an active layer configured to form capacitance by including first and second internal electrodes alternately exposed to both end surfaces of the ceramic body, having at least one of the dielectric layers interposed therebetween; an upper cover layer formed on the active layer; a lower cover layer formed below the active layer and being thicker than the upper cover layer; and first and second external electrodes covering the end surfaces of the ceramic body. At least one edge of the ceramic body in length, width, and thickness directions may be rounded. When a radius of curvature of the edge is defined as R and a thickness of the upper cover layer is defined as D, R/D may be in a range of 0.1 to 0.7.

14 Claims, 7 Drawing Sheets

(56) References Cited

FOREIGN PATENT DOCUMENTS

| JP | 2006-310700 A | 11/2006 | | |
|---|---|---|---|---|
| KR | 10-2009-0083568 A | 8/2009 | | |
| KR | 10-2012-0089199 A | 8/2012 | | |
| KR | 20130135015 | * | 12/2013 | ............... H01G 4/12 |

* cited by examiner
† cited by third party

US 9,343,229 B2

MULTILAYER CERAMIC CAPACITOR AND BOARD HAVING THE SAME MOUNTED THEREON

CROSS-REFERENCE TO RELATED APPLICATION

This application claims the benefit of Korean Patent Application No. 10-2013-0086319 filed on Jul. 22, 2013, with the Korean Intellectual Property Office, the disclosure of which is incorporated herein by reference.

BACKGROUND

The present disclosure relates to a multilayer ceramic capacitor and a board having the same mounted thereon.

A multilayer ceramic capacitor, one of multilayer chip electronic components, is a chip-type condenser mounted on printed circuit boards of various electronic products such as display devices including liquid crystal displays (LCDs), plasma display panels (PDPs), and the like, computers, personal digital assistants (PDAs), and mobile phones to serve to charge or discharge electricity.

Since such a multilayer ceramic capacitor (MLCC) has advantages such as a small size, high capacitance, easiness of mounting, or the like, the multilayer ceramic capacitor may be used in various electronic devices.

The multilayer ceramic capacitor may have a structure in which a plurality of dielectric layers and internal electrodes having opposite polarities and interposed between the dielectric layers are alternately stacked.

Since the dielectric layers have piezoelectric and electrostrictive properties, when direct current (DC) or alternating current (AC) voltage is applied to the multilayer ceramic capacitor, a piezoelectric phenomenon occurs between the internal electrodes, causing vibrations.

Such vibrations may be transferred to a printed circuit board through external electrodes of the multilayer ceramic capacitor, such that the entire printed circuit board becomes a sound reflective surface to generate a vibration sound as noise.

The vibration sound may have a frequency corresponding to an audio frequency range of 20 Hz to 20000 Hz making listeners uncomfortable. The vibration sound, potentially providing unpleasant feeling to listeners, is known as acoustic noise.

In order to decrease the acoustic noise, research into a product having an increase in a thickness of a lower cover layer of the multilayer ceramic capacitor has been conducted.

In addition, when the multilayer ceramic capacitor having a relatively thick lower cover layer is mounted on a printed circuit board, such a thick lower cover layer may be positioned downwards in order to decrease the acoustic noise, resulting in a horizontal mounting type multilayer ceramic capacitor.

However, in the case in which the product having the multilayer ceramic capacitor with the thick lower cover layer is mounted on a board, it may topple over and mounting defects may frequently occur.

Meanwhile, chipping defects, resulting from ceramic bodies being crashed into each other and being broken, may occur in a process of manufacturing multilayer ceramic electronic components. In order to prevent the chipping defects, a method of polishing edges and corners of the ceramic bodies has been used.

However, in the case in which the polishing process is excessively or insufficiently performed on the edges and the corners of the ceramic body, this may affect reliability of the multilayer ceramic electronic component.

Therefore, research into a multilayer ceramic electronic component having improved reliability by decreasing acoustic noise and preventing mounting defects (that is, blocking the multilayer ceramic electronic component from toppling over when mounted on a board) and chipping defects has been still demanded.

SUMMARY

An aspect of the present disclosure may provide a multilayer ceramic capacitor and a board having the same mounted thereon.

According to an aspect of the present disclosure, a multilayer ceramic capacitor may include: a ceramic body in which a plurality of dielectric layers having an average thickness of 0.2 µm to 2.0 µm are stacked; an active layer configured to form capacitance by including first and second internal electrodes alternately exposed to both end surfaces of the ceramic body, having at least one of the dielectric layers interposed therebetween; an upper cover layer formed on the active layer; a lower cover layer formed below the active layer and being thicker than the upper cover layer; and first and second external electrodes covering the end surfaces of the ceramic body, wherein at least one edge of the ceramic body in length, width, and thickness directions may be rounded, and when a radius of curvature of the edge is defined as R and a thickness of the upper cover layer is defined as D, R/D may be in a range of 0.1 to 0.7 ($0.1 \leq R/D \leq 0.7$).

When half of a total thickness of the ceramic body is defined as A, a thickness of the lower cover layer is defined as B, and half of a total thickness of the active layer is defined C, a ratio (B+C)/A of deviation between a center of the active layer and a center of the ceramic body may be in a range of 1.063 to 1.745 ($1.063 \leq (B+C)/A \leq 1.745$).

When a thickness of the lower cover layer is defined as B and the thickness of the upper cover layer is defined as D, a ratio D/B of the thickness D of the upper cover layer to the thickness B of the lower cover layer may be in a range of 0.021 to 0.422 ($0.021 \leq D/B \leq 0.422$).

When half of a total thickness of the ceramic body is defined as A and a thickness of the lower cover layer is defined as B, a ratio B/A of the thickness B of the lower cover layer to the half A of the total thickness of the ceramic body may be in a range of 0.329 to 1.522 ($0.329 \leq B/A \leq 1.522$).

When a thickness of the lower cover layer is defined as B and half of a total thickness of the active layer is defined as C, a ratio C/B of the half C of the total thickness of the active layer to the thickness B of the lower cover layer may be in a range of 0.146 to 2.458 ($0.146 \leq C/B \leq 2.458$).

Points of inflection (PI) formed on the end surfaces of the ceramic body may be formed in a position equal to or below a center of the ceramic body in a thickness direction, due to a difference between a deformation rate occurring in a center of the active layer and a deformation rate occurring in the lower cover layer, when voltages are applied thereto.

The number of stacked dielectric layers may be 150 or greater.

According to another aspect of the present disclosure, a board having a multilayer ceramic capacitor mounted thereon may include: a printed circuit board having first and second electrode pads formed thereon; and the multilayer ceramic capacitor mounted on the printed circuit board, wherein the multilayer ceramic capacitor includes: a ceramic body in which a plurality of dielectric layers having an average thickness of 0.2 µm to 2.0 µm are stacked; an active layer configured to form capacitance by including first and second internal electrodes alternately exposed to both end surfaces of the ceramic body, having at least one of the dielectric layers interposed therebetween; an upper cover layer formed on the active layer; a lower cover layer formed below the active layer and being thicker than the upper cover layer; and first and second external electrodes covering the end surfaces of the ceramic body, at least one edge of the ceramic body in length, width, and thickness directions being rounded, and when a radius of curvature of the edge is defined as R and a thickness of the upper cover layer is defined as D, R/D being in a range of 0.1 to 0.7 ($0.1 \leq R/D \leq 0.7$).

When half of a total thickness of the ceramic body is defined as A, a thickness of the lower cover layer is defined as B, and half of a total thickness of the active layer is defined C, a ratio (B+C)/A of deviation between a center of the active layer and a center of the ceramic body may be in a range of 1.063 to 1.745 ($1.063 \leq (B+C)/A \leq 1.745$).

When a thickness of the lower cover layer is defined as B and the thickness of the upper cover layer is defined as D, a ratio D/B of the thickness D of the upper cover layer to the thickness B of the lower cover layer may be in a range of 0.021 to 0.422 ($0.021 \leq D/B \leq 0.422$).

When half of a total thickness of the ceramic body is defined as A and a thickness of the lower cover layer is defined as B, a ratio B/A of the thickness B of the lower cover layer to the half A of the total thickness of the ceramic body may be in a range of 0.329 to 1.522 ($0.329 \leq B/A \leq 1.522$).

When a thickness of the lower cover layer is defined as B and half of a total thickness of the active layer is defined C, a ratio C/B of the half C of the total thickness of the active layer to the thickness B of the lower cover layer may be in a range of 0.146 to 2.458 ($0.146 \leq C/B \leq 2.458$).

Points of inflection (PI) formed on the end surfaces of the ceramic body may be formed in a position equal to or below a center of the ceramic body in a thickness direction, due to a difference between a deformation rate occurring in a center of the active layer and a deformation rate occurring in the lower cover layer, when voltages are applied thereto.

The number of stacked dielectric layers may be 150 or greater.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
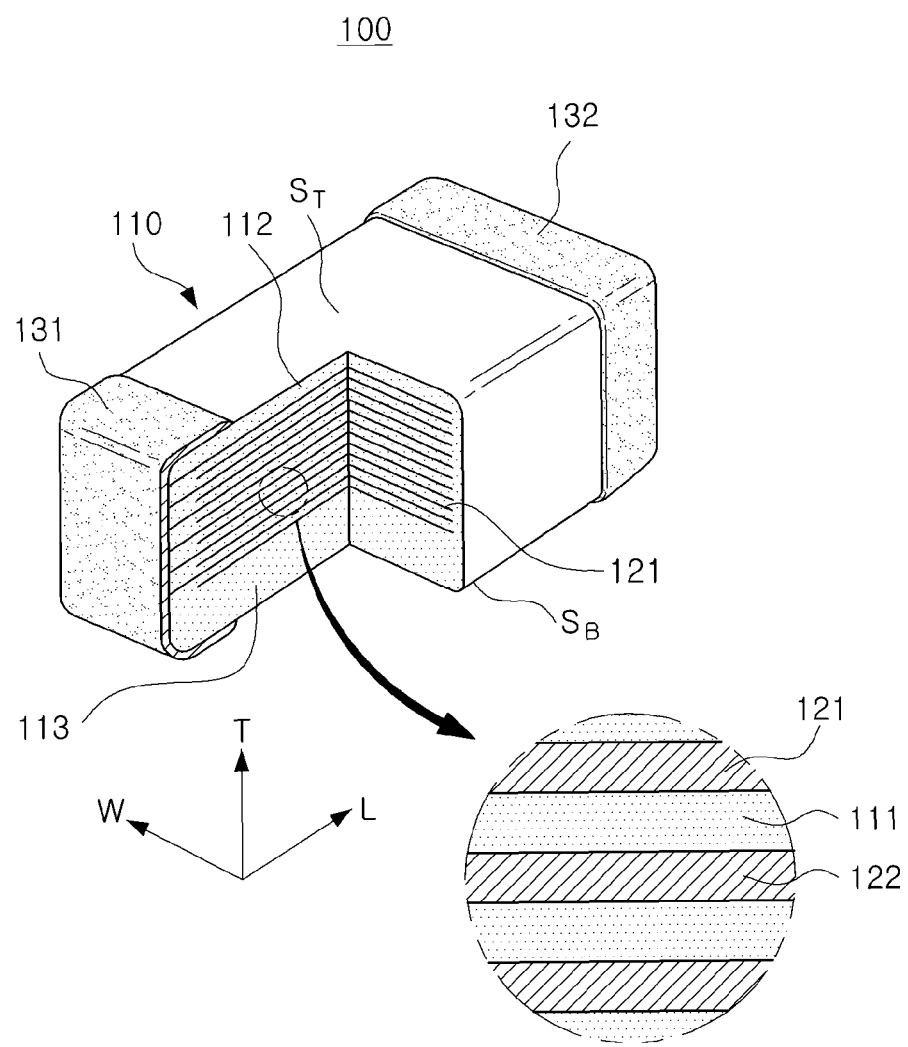
FIG. 1 is a cut-away perspective view schematically showing a multilayer ceramic capacitor according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined in order to clearly describe exemplary embodiments of the present disclosure. L, W and T shown in the accompanying drawings refer to a length direction, a width direction, and a thickness direction, respectively. Here, the thickness direction may be the same as a direction in which dielectric layers are stacked.

Further, in the following exemplary embodiments, for convenience of explanation, surfaces of a ceramic body in the length direction thereof on which first and second external electrodes are formed are defined as both end surfaces, surfaces of the ceramic body vertically intersecting with the end surfaces are defined as both side surfaces.

In addition, an upper surface of the ceramic body at which an upper cover layer is formed is represented by $S_T$ and a lower surface of the ceramic body at which a lower cover layer is formed is represented by $S_B$.

FIG. 1 is a cut-away perspective view schematically showing a multilayer ceramic capacitor according to an exemplary embodiment of the present disclosure.

Figure 2:
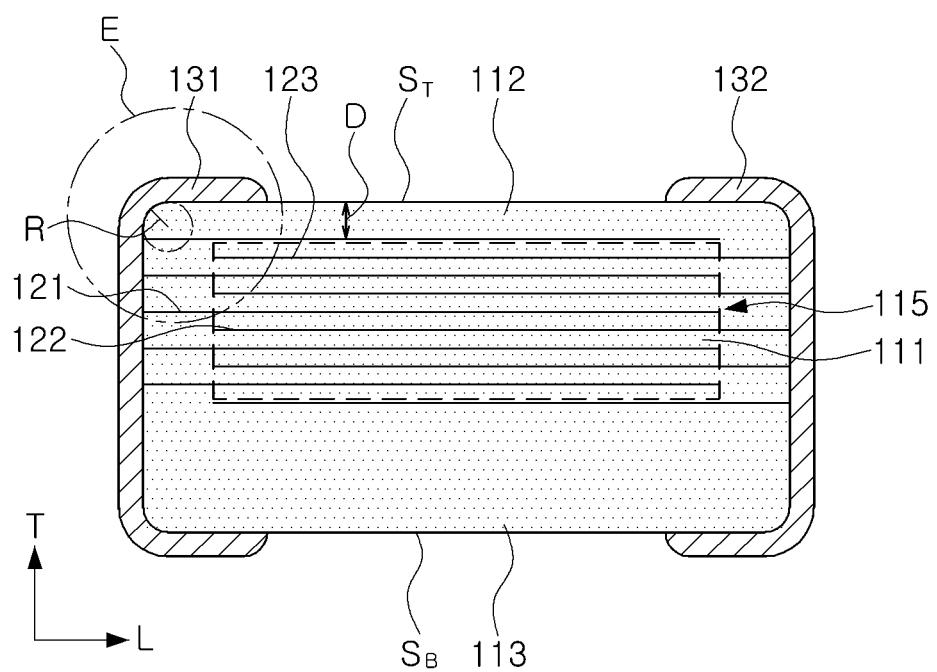
FIG. 2 is a cross-sectional view of the multilayer ceramic capacitor of FIG. 1 taken in a length direction.

FIG. 2 is a cross-sectional view of the multilayer ceramic capacitor of FIG. 1 taken in the length direction.

Figure 3:
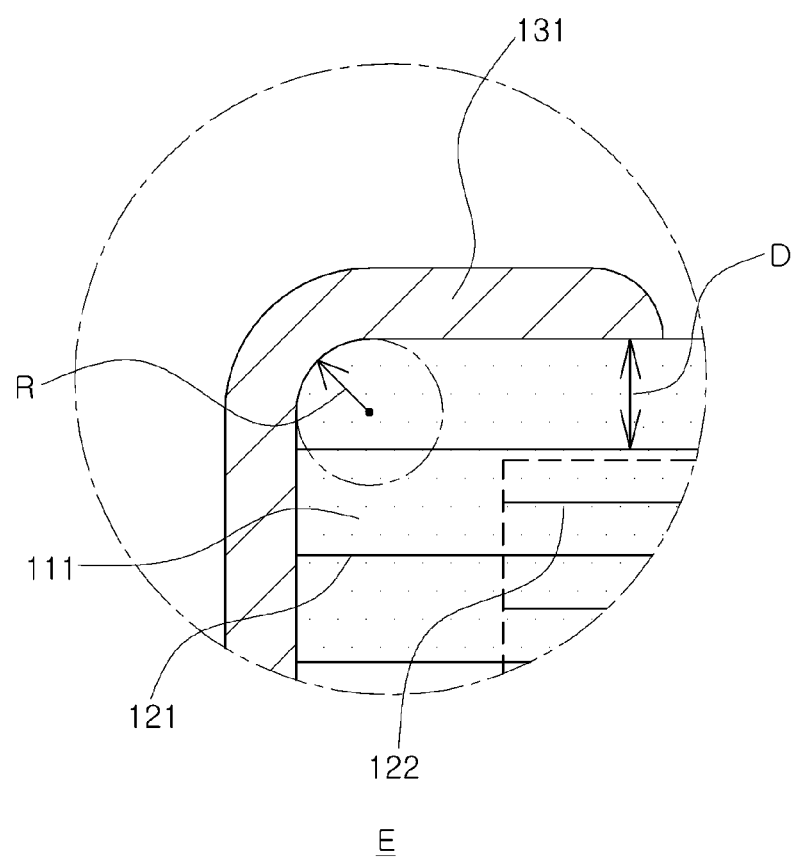
FIG. 3 is an enlarged view of portion E of FIG. 2.

FIG. 3 is an enlarged view of portion E of FIG. 2.

Referring to FIGS. 1 through 3, a multilayer ceramic capacitor 100 according to an exemplary embodiment of the present disclosure may include a ceramic body 110, an active layer 115 having first and second internal electrodes 121 and 122, upper and lower cover layers 112 and 113, and first and second external electrodes 131 and 132 covering both end surfaces of the ceramic body 110.

The ceramic body 110 may be formed by stacking a plurality of dielectric layers 111 and then sintering the stacked dielectric layers. In this case, a shape and a dimension of the ceramic body 110 and the number of stacked dielectric layers 111 are not limited to those of the present embodiment shown in the accompanying drawings.

In addition, the plurality of dielectric layers 111 configuring the ceramic body 110 may be in a sintered state, and adjacent dielectric layers 111 may be integrated so that boundaries therebetween are not readily apparent without using a scanning electron microscope (SEM).

The ceramic body 110 may include the active layer 115 as a part contributing to forming capacitance in the capacitor and the upper and lower cover layers 112 and 113 formed as upper and lower margin parts on and below the active layer 115, respectively.

The active layer 115 may be formed by repeatedly stacking a plurality of first and second internal electrodes 121 and 122, having at least one of the dielectric layers 111 interposed therebetween.

According to the exemplary embodiment of the present disclosure, an average thickness of the dielectric layer 111 may be changed according to target capacitance generated in the multilayer ceramic capacitor 100, but an average thickness of a single dielectric layer may be 0.2 μm to 2.0 μm after sintering.

The average thickness of the dielectric layer 111 may be measured from an image obtained by scanning a cross-section of the ceramic body 110 in the length direction using a scanning electron microscope (SEM) as shown in FIG. 2.

For example, as shown in FIG. 2, with respect to the dielectric layer 111 randomly selected from an image obtained by scanning a cross-section of the ceramic body 110 in a length-thickness (L-T) direction after being cut in a central portion of the ceramic body 110 in the width (W) direction, using the scanning electron microscope (SEM), thicknesses of the dielectric layer 111 at thirty equidistant points thereof may be measured and an average value thereof may be calculated.

The thicknesses of the dielectric layer at thirty equidistant points may be measured in a capacitance forming part, a region in which the first and second internal electrodes 121 and 122 are overlapped with each other.

In addition, when an average thickness of at least ten dielectric layers is measured by the above-mentioned method, the average thickness of the dielectric layer may be further generalized.

When the average thickness of the dielectric layer 111 is in a range of 0.2 μm to 2.0 μm, improved reliability may be achieved in the multilayer ceramic capacitor.

In the case in which the average thickness of the dielectric layer is less than 0.2 μm, a distance between the internal electrodes is so close that a short circuit occurs. In the case in which the average thickness of the dielectric layer is greater than 2.0 μm, high capacitance may not be generated in the multilayer ceramic capacitor.

Further, the dielectric layer 111 may contain ceramic powder having high permittivity, for example, barium titanate ($BaTiO_3$) based powder, strontium titanate ($SrTiO_3$) based powder, or the like, but the present disclosure is not limited thereto.

The upper and lower cover layers 112 and 113 may have the same material and configuration as those of the dielectric layers 111, except that they do not include internal electrodes.

The upper and lower cover layers 112 and 113 may be formed by stacking a single dielectric layer or two or more dielectric layers on upper and lower surfaces of the active layer 115 in a vertical direction, respectively, and generally serve to prevent the first and second internal electrodes 121 and 122 from being damaged by physical or chemical stress.

In addition, the lower cover layer 113 may be thicker than the upper cover layer 112 by having an increased number of stacked dielectric layers as compared to the upper cover layer 112.

Meanwhile, the first and second internal electrodes 121 and 122, a pair of electrodes having opposite polarities, may be formed by printing a conductive paste containing a conductive metal on the dielectric layers 111 at a predetermined thickness.

In addition, the first and second internal electrodes 121 and 122 may be alternately exposed to both end surfaces of the ceramic body, and may be electrically insulated from each other by the dielectric layer 111 disposed therebetween.

That is, the first and second internal electrodes 121 and 122 may be electrically connected to the first and second external electrodes 131 and 132 through portions thereof alternately exposed to the end surfaces of the ceramic body 110, respectively.

Therefore, when voltage is applied to the first and second external electrodes 131 and 132, electric charges are accumulated between the first and second internal electrodes 121 and 122 facing each other. In this case, capacitance of the multilayer ceramic capacitor 100 may be in proportion to an area of an overlapped region between the first and second internal electrodes 121 and 122.

Further, the conductive metal contained in the conductive paste forming the first and second internal electrodes 121 and 122 may be nickel (Ni), copper (Cu), palladium (Pd), or an alloy thereof, but the present disclosure is not limited thereto.

Further, as a method of printing the conductive paste, a screen printing method, a gravure printing method, or the like, may be used, but the present disclosure is not limited thereto.

Meanwhile, the first and second external electrodes 131 and 132 may be formed of a conductive paste containing a conductive metal, wherein the conductive metal may be nickel (Ni), copper (Cu), palladium (Pd), gold (Au), or an alloy thereof, but the present disclosure is not limited thereto.

According to the exemplary embodiment of the present disclosure, at least one edge of the ceramic body 110 in the length, width, and thickness directions may be rounded, and when a radius of curvature of the edge is defined as R and a thickness of the upper cover layer 112 is defined as D, R/D may be in a range of 0.1 to 0.7 ($0.1 \leq R/D \leq 0.7$).

Generally, in the case in which a product has a structure in which a thickness of the lower cover layer of the multilayer ceramic capacitor is increased in order to decrease acoustic noise, it may topple over when mounted on a board, resulting in an increase in the frequency of a mounting defect.

That is, a height of the product having such a structure in which the thickness of the lower cover layer of the multilayer ceramic capacitor is increased is greater than that of a general multilayer ceramic capacitor, and the active layer 115 is positioned to be relatively high with respect to the center of the ceramic body 110, such that the center of gravity of the ceramic body itself is moved upwardly.

Therefore, when the product is mounted on the board, it may easily topple over as compared to the general multilayer ceramic capacitor, resulting in an increase in the frequency of a mounting defect.

Meanwhile, a chipping defect, resulting from ceramic bodies being crashed into each other and being broken, may occur in a process of manufacturing multilayer ceramic capacitors. In order to prevent the chipping defect, a method of polishing edges and corners of the ceramic body has been used.

However, in the case in which the polishing process is excessively or insufficiently performed on the edges and the corners of the ceramic body, this may affect reliability of the multilayer ceramic capacitor.

However, according to the exemplary embodiment of the present disclosure, at least one edge of the ceramic body 110 in the length, width, and thickness directions may be rounded, and when a radius of curvature of the edge is defined as R and a thickness of the upper cover layer 112 is defined as D, R/D may be controlled to be in a range of 0.1 to 0.7 ($0.1 \leq R/D \leq 0.7$, thereby preventing the chipping defect, resulting from damages to ceramic bodies due to crashes between the ceramic bodies or between the ceramic body and other components, and the mounting defect, in which a multilayer ceramic capacitor having reduced acoustic noise topples over when mounted on the board.

In the case in which the ratio R/D of the radius R of curvature of the edge to the thickness D of the upper cover layer 112 is less than 0.1, the chipping defect, resulting from damages to the ceramic bodies due to crashes between the ceramic bodies or between the ceramic body and other components, may occur.

Meanwhile, in the case in which the ratio R/D of the radius R of curvature of the edge to the thickness D of the upper cover layer 112 is greater than 0.7, when the multilayer ceramic capacitor is mounted on the board, it may topple over and the mounting defect may occur.

According to the exemplary embodiment of the present disclosure, in order to control the radius R of curvature of the edge and the thickness D of the upper cover layer 112 to satisfy $0.1 \leq R/tc \leq 0.7$, the edges and the corners of the ceramic body may be polished.

The polishing process may be performed using a polishing apparatus, wherein the polishing apparatus is not particularly limited, but an apparatus used to polish a general ceramic body may be used.

As described above, since the ceramic body is polished before sintering, this process may prevent the chipping defects occurring in cases in which the ceramic bodies 110 having brittleness after sintering are crashed into each other to thereby be broken during a delivery process in a process of manufacturing multilayer ceramic capacitors may be prevented.

Further, since the ceramic body is polished before sintering as described above, when the multilayer ceramic capacitor after sintering is mounted on the board, the rounded edges of the ceramic body, particularly, the rounded edges of the ceramic body in the length direction may prevent the multilayer ceramic capacitor from toppling over.

Hereinafter, a relationship between dimensions of components included in the multilayer ceramic capacitor according to this exemplary embodiment and acoustic noise will be described.

Figure 4:
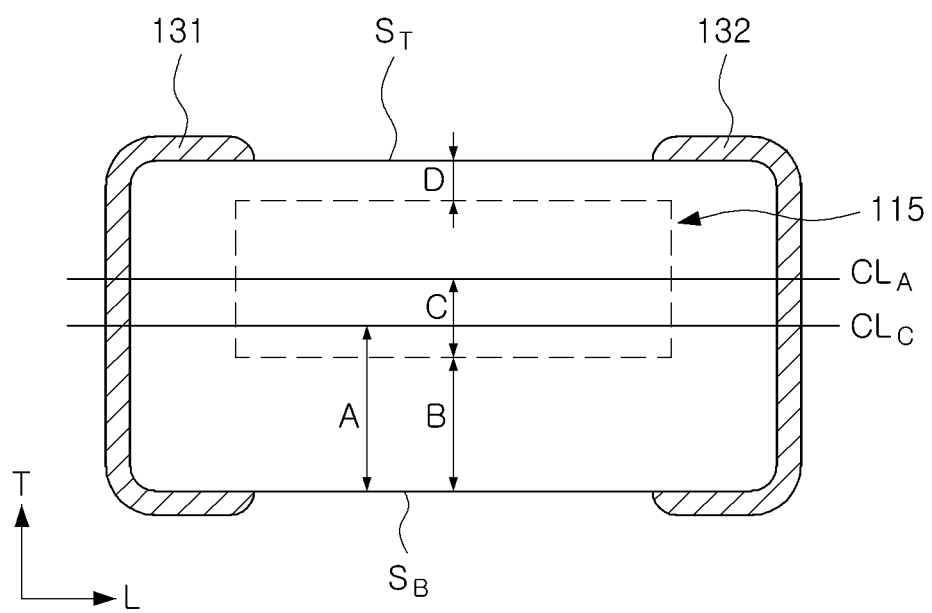
FIG. 4 is a schematic cross-sectional view of the multilayer ceramic capacitor of FIG. 1 taken in the length direction, in order to illustrate a dimensional relationship between components included in the multilayer ceramic capacitor.

FIG. 4 is a cross-sectional view of the multilayer ceramic capacitor of FIG. 1 taken in the length direction in order to illustrate a dimensional relationship between the components included in the multilayer ceramic capacitor.

Referring to FIG. 4, half of the total thickness of the ceramic body 110 is defined as A, a thickness of the lower cover layer 113 is defined as B, half of the total thickness of the active layer 115 is defined as C, and the thickness of the upper cover layer 112 is defined as D.

Here, the total thickness of the ceramic body 110 may refer to a distance from the upper surface $S_T$ of the ceramic body 110 to the lower surface $S_B$ thereof, and the total thickness of the active layer 115 may refer to a distance from an upper surface of a first internal electrode 121 disposed at an uppermost portion of the active layer 115 to a lower surface of a second internal electrode 122 disposed at a lowermost portion of the active layer 115.

In addition, the thickness B of the lower cover layer 113 may refer to a distance from the lower surface of the second internal electrode 122 disposed at the lowermost portion of the active layer 115 in the thickness direction to the lower surface $S_B$ of the ceramic body 110, and the thickness D of the upper cover layer 112 may refer to a distance from the upper surface of the first internal electrode 121 disposed at the uppermost portion of the active layer 115 in the thickness direction to the upper surface $S_T$ of the ceramic body 110.

When voltages having different polarities are applied to the first and second electrodes 131 and 132 formed on both end portions of the multilayer ceramic capacitor 100, the ceramic body 110 may be expanded and contracted in the thickness direction by an inverse piezoelectric effect of the dielectric layer 111, and both end portions of the ceramic body having the first and second external electrodes 131 and 132 formed thereon may be contracted and expanded by the Poisson effect as opposed to the above-mentioned expansion and contraction of the ceramic body 110 in the thickness direction.

Here, portions of both ends of the ceramic body in the length direction having first and second external electrodes 131 and 132 formed thereon corresponding to the center $CL_A$ of the active layer 115 may maximally expand and contract, which is a factor in the generation of acoustic noise.

That is, in this exemplary embodiment, in order to reduce the acoustic noise, points of inflection (PI) formed on both end surfaces of the ceramic body 110 may be positioned at a height equal to or below that of the center $CL_c$ of the ceramic body 110 in the thickness direction, due to a difference between a deformation rate occurring in the center $CL_A$ of the active layer 115 and a deformation rate occurring in the lower cover layer 113 when the voltages are applied thereto.

In this case, in order to further reduce the acoustic noise, a ratio of deviation between the center $CL_A$ of the active layer 115 and the center $CL_c$ of the ceramic body 110, that is, (B+C)/A may be in a range of 1.063 to 1.745 ($1.063 \leq (B+C)/A \leq 1.745$).

Further, a ratio of the thickness D of the upper cover layer 112 to the thickness B of the lower cover layer 113, that is, D/B may be in a range of 0.021 to 0.422 ($0.021 \leq D/B \leq 0.422$).

In addition, a ratio of the thickness B of the lower cover layer 113 to the half A of the thickness of the ceramic body, that is, B/A may be in a range of 0.329 to 1.522 ($0.329 \leq B/A \leq 1.522$).

Further, a ratio of the half C of the thickness of the active layer 115 to the thickness B of the lower cover layer, that is, C/B may be in a range of 0.146 to 2.458 ($0.146 \leq C/B \leq 2.458$).

Experimental Example

Multilayer ceramic capacitors according to Inventive Examples and Comparative Examples were manufactured as follows.

Slurry containing a powder such as barium titanate (BaTiO$_3$), or the like, was applied to carrier films and dried to prepare a plurality of ceramic green sheets having a thickness of 1.8 μm.

Next, a conductive paste for nickel internal electrodes was applied to the ceramic green sheets using a screen to form internal electrodes.

About 370 ceramic green sheets were stacked. In this case, ceramic green sheets having no internal electrode were more densely stacked below the multilayer body in which the ceramic green sheets having the internal electrodes were stacked, as compared with above the multilayer body. Isostatic pressing was performed on this multilayer body at 85° C. and 1000 kgf/cm$^2$.

The pressed ceramic multilayer body was cut into individual chips, and the cut chips were subjected to a de-binding process at 230° C. for 60 hours under air atmosphere.

Then, they were sintered at 1200° C. under reducing atmosphere having oxygen partial pressure of $10^{-11}$ atm to $10^{-10}$ atm lower than Ni—NiO equilibrium oxygen partial pressure, so that the internal electrodes were not oxidized. A chip size of the multilayer chip capacitor after sintering was about 1.64 mm×0.88 mm (Length×Width (L×W), 1608 size). Here, a manufacturing tolerance was in a range of ±0.1 mm (length× Width (L×W)), and experiments were performed on samples satisfying this range, such that acoustic noise was measured in each sample.

Next, processes such as an external electrode forming process, a plating process, and the like, were performed to manufacture the multilayer ceramic capacitor.

acoustic noise was measured through a mike installed directly above the printed circuit board.

In Table 1, samples 1 to 3 were Comparative Examples of a capacitor having a cover symmetrical structure in which the thickness B of the lower cover layer 113 and the thickness D of the upper cover layer 112 were almost same as each other, and samples 4 to 13 were Comparative Examples of a capaci-

TABLE 1

| Sample | A (μm) | B (μm) | C (μm) | D (μm) | (B + C)/A | B/A | D/B | C/B | AN (dB) | Formation of Target Capacitance |
|---|---|---|---|---|---|---|---|---|---|---|
| 1* | 405.5 | 40.2 | 365.4 | 39.9 | 1.000 | 0.099 | 0.993 | 9.090 | 29.5 | OK |
| 2* | 436.0 | 70.4 | 365.9 | 69.7 | 1.001 | 0.161 | 0.990 | 5.197 | 25.7 | OK |
| 3* | 455.5 | 90.8 | 364.3 | 91.5 | 0.999 | 0.199 | 1.008 | 4.012 | 23.1 | OK |
| 4* | 508.1 | 24.9 | 361.1 | 269.1 | 0.760 | 0.049 | 10.807 | 14.502 | 31.2 | OK |
| 5* | 456.6 | 25.2 | 360.1 | 167.8 | 0.844 | 0.055 | 6.659 | 14.290 | 32.5 | OK |
| 6* | 527.3 | 30.2 | 191.0 | 642.4 | 0.419 | 0.057 | 21.272 | 6.325 | 30.3 | OK |
| 7* | 414.5 | 30.9 | 188.8 | 420.4 | 0.530 | 0.075 | 13.605 | 6.110 | 30.5 | OK |
| 8* | 516.2 | 39.4 | 360.7 | 271.5 | 0.775 | 0.076 | 6.891 | 9.155 | 28.2 | OK |
| 9* | 446.0 | 39.8 | 365.5 | 121.2 | 0.909 | 0.089 | 3.045 | 9.183 | 29.1 | OK |
| 10* | 469.1 | 40.6 | 364.2 | 169.1 | 0.863 | 0.087 | 4.165 | 8.970 | 27.9 | OK |
| 11* | 416.2 | 40.7 | 360.7 | 70.3 | 0.964 | 0.098 | 1.727 | 8.862 | 28.4 | OK |
| 12* | 428.3 | 40.8 | 360.0 | 95.7 | 0.936 | 0.095 | 2.346 | 8.824 | 28.9 | OK |
| 13* | 495.9 | 40.9 | 364.9 | 221.0 | 0.818 | 0.082 | 5.403 | 8.922 | 28.1 | OK |
| 14* | 435.9 | 25.0 | 421.3 | 4.2 | 1.024 | 0.057 | 0.168 | 16.852 | 31.6 | OK |
| 15* | 420.7 | 70.4 | 365.9 | 39.1 | 1.037 | 0.167 | 0.555 | 5.197 | 25.7 | OK |
| 16 | 431.7 | 94.8 | 364.3 | 40.0 | 1.063 | 0.220 | 0.422 | 3.843 | 19.9 | OK |
| 17 | 443.0 | 103.8 | 389.1 | 4.0 | 1.113 | 0.234 | 0.039 | 3.749 | 19.3 | OK |
| 18 | 443.7 | 119.8 | 363.2 | 41.1 | 1.089 | 0.270 | 0.343 | 3.032 | 18.7 | OK |
| 19 | 447.1 | 147.3 | 362.1 | 22.7 | 1.139 | 0.329 | 0.154 | 2.458 | 17.9 | OK |
| 20 | 452.8 | 164.7 | 360.2 | 20.4 | 1.159 | 0.364 | 0.124 | 2.187 | 17.3 | OK |
| 21 | 448.7 | 170.3 | 361.0 | 5.1 | 1.184 | 0.380 | 0.030 | 2.120 | 17.2 | OK |
| 22 | 470.7 | 170.4 | 365.4 | 40.2 | 1.138 | 0.362 | 0.236 | 2.144 | 17.4 | OK |
| 23 | 491.9 | 220.3 | 360.8 | 41.8 | 1.181 | 0.448 | 0.190 | 1.638 | 16.9 | OK |
| 24 | 500.6 | 270.2 | 360.5 | 9.9 | 1.260 | 0.540 | 0.037 | 1.334 | 16.8 | OK |
| 25 | 516.9 | 270.4 | 361.8 | 39.7 | 1.223 | 0.523 | 0.147 | 1.338 | 16.7 | OK |
| 26 | 502.1 | 364.9 | 312.3 | 14.7 | 1.349 | 0.727 | 0.040 | 0.856 | 16.6 | OK |
| 27 | 407.5 | 421.8 | 189.1 | 14.9 | 1.499 | 1.035 | 0.035 | 0.448 | 16.6 | OK |
| 28 | 445.8 | 493.3 | 179.3 | 39.7 | 1.509 | 1.107 | 0.080 | 0.363 | 16.5 | OK |
| 29 | 483.7 | 493.3 | 160.1 | 15.2 | 1.638 | 1.307 | 0.024 | 0.253 | 16.4 | OK |
| 30 | 520.0 | 643.4 | 190.7 | 15.2 | 1.604 | 1.237 | 0.024 | 0.296 | 16.4 | OK |
| 31 | 486.4 | 685.3 | 121.1 | 45.3 | 1.658 | 1.409 | 0.066 | 0.177 | 16.4 | OK |
| 32 | 507.2 | 742.7 | 120.8 | 30.1 | 1.702 | 1.464 | 0.041 | 0.163 | 16.4 | OK |
| 33 | 515.2 | 773.9 | 118.2 | 20.1 | 1.732 | 1.502 | 0.026 | 0.153 | 16.4 | OK |
| 34 | 524.5 | 798.2 | 116.9 | 16.9 | 1.745 | 1.522 | 0.021 | 0.146 | 16.3 | OK |
| 35* | 533.4 | 832.4 | 109.8 | 14.8 | 1.766 | 1.561 | 0.018 | 0.132 | 16.3 | NG |
| 36* | 533.3 | 841.1 | 105.3 | 14.9 | 1.775 | 1.577 | 0.018 | 0.125 | 16.3 | NG |
| 37* | 534.1 | 849.7 | 101.2 | 16.1 | 1.780 | 1.591 | 0.019 | 0.119 | 16.3 | NG |

*Comparative Example, AN: Acoustic Noise

Data of Table 1 were obtained by measuring each dimension from an image obtained by scanning a cross-section of the ceramic body 110 of the multilayer ceramic capacitor 100 in a length-thickness (L-T) direction, taken along a central portion of the ceramic body 110 in a width (W) direction using a scanning electron microscope (SEM) as shown in FIG. 3.

Here, half of the total thickness of the ceramic body 110 was defined as A, a thickness of the lower cover layer 113 was defined as B, half of the total thickness of the active layer 115 was defined C, and a thickness of the upper cover layer 112 was defined as D, as described above.

In order to measure the acoustic noise, after one sample (multilayer chip capacitor) per a board for measuring acoustic noise was mounted on a printed circuit board in a vertical direction, the board was mounted on a measurement jig.

In addition, DC voltage and voltage variation were applied to both terminals of the sample mounted on the measurement jig using a DC power supply and a function generator. The tor having a structure in which the thickness D of the upper cover layer 112 was greater than the thickness B of the lower cover layer.

Further, samples 14 and 15, and 35 to 37 were Comparative Examples of a capacitor having a structure in which the thickness B of the lower cover layer 113 was greater than the thickness D of the upper cover layer 112, and samples 16 to 34 were inventive Examples according to an exemplary embodiment of the present disclosure.

Here, in the case in which (B+C)/A was almost 1, it means that the center of the active layer 115 did not largely deviate from the center of the ceramic body 110. In samples 1 to 3 having the cover symmetrical structure in which the thickness B of the lower cover layer 113 and the thickness D of the upper cover layer 112 were almost similar to each other, (B+C)/A was almost 1.

When (B+C)/A was larger than 1, it means that the center of the active layer 115 deviated upwardly from the center of the ceramic body 110, and when (B+C)/A was smaller than 1, it means that the center of the active layer 115 deviated downwardly from the center of the ceramic body 110.

Referring to Table 1, it can be seen that in samples 16 to 34 corresponding to Inventive Examples in which the ratio of deviation between the center of the active layer 115 and the center of the ceramic body 110, that is, (B+C)/A was in a range of 1.063 to 1.745 (1.063≤(B+C)/A≤1.745), the acoustic noise was significantly reduced to be less than 20 dB.

In addition, sample 1 to 15 in which the ratio of deviation between the center of the active layer 115 and the center of the ceramic body 110, that is, (B+C)/A was less than 1.063, had a structure in which the center of the active layer 115 almost did not deviate from the center of the ceramic body 110 or the center of the active layer 115 deviated downwardly from the center of the ceramic body 110.

In samples 1 to 15 in which (B+C)/A was less than 1.063, the acoustic noise was 25 dB to 32.5 dB. Therefore, it can be seen that there is no effect of reducing the acoustic noise in these samples, as compared to Inventive Examples.

In addition, in samples 35 to 37 in which the ratio of deviation between the center of the active layer 115 and the center of the ceramic body 110, that is, (B+C)/A was greater than 1.745, a ratio of capacitance to target capacitance was low, such that a capacitance defect occurred.

In Table 1, the case in which the formation of capacitance (that is, a ratio of capacitance to target capacitance) was represented by "NG," it means that the ratio of capacitance to target capacitance was less than 80%.

Further, it can be seen that in Examples in which the ratio (D/B) of the thickness D of the upper cover layer 112 to the thickness B of the lower cover layer 113 was in a range of 0.021 to 0.422 (0.021≤D/B≤0.422), the acoustic noise was significantly reduced.

On the other hand, it can be seen that in Comparative Examples in which the ratio (D/B) of the thickness D of the upper cover layer 112 to the thickness B of the lower cover layer 113 was greater than 0.422, the acoustic noise was not reduced.

In the case in which the ratio (D/B) of the thickness D of the upper cover layer 112 to the thickness B of the lower cover layer 113 was less than 0.021, the thickness B of the lower cover layer 113 was excessively thick as compared to the thickness D of the upper cover layer 112, such that cracks or delamination occurred. In addition, due to the low capacitance as compared to the target capacitance, the capacitance defect occurred.

It can be seen that in samples 19 to 34, corresponding to Inventive Examples in which the ratio (B/A) of the thickness B of the lower cover layer 113 to the thickness A of the ceramic body 110 was in a range of 0.329 to 1.522 (0.329≤B/A≤1.522) and the ratio (C/B) of the thickness C of the active layer 115 to the thickness B of the lower cover layer 113 was in a range of 0.146 to 2.458 (0.146≤C/B≤2.458), the acoustic noise was further reduced to be less than 18 dB.

On the other hand, in samples 35 to 37 in which the ratio (B/A) of the thickness B of the lower cover layer 113 to the thickness A of the ceramic body 110 was greater than 1.522, or the ratio (C/B) of the thickness C of the active layer 115 to the thickness B of the lower cover layer 113 was less than 0.146, the capacitance thereof was excessively low as compared to the target capacitance, such that the capacitance defect occurred.

The following Table 2 shows data obtained by comparing the number of multilayer ceramic capacitor samples in which chipping defects and mounting defects occurred, according to the ratio R/D of the radius R of curvature of an edge of the ceramic body to the thickness D of the upper cover layer 112.

TABLE 2

| Sample | R/D | Chipping Defect (The Number of Defective Samples/The Number of Test Samples) | Mounting Defect (The Number of Defective Samples/The Number of Test Samples) |
|---|---|---|---|
| *1 | 0.01 | 21/200 | 0/108 |
| *2 | 0.05 | 6/200 | 0/108 |
| 3 | 0.1 | 0/200 | 0/108 |
| 4 | 0.2 | 0/200 | 0/108 |
| 5 | 0.3 | 0/200 | 0/108 |
| 6 | 0.4 | 0/200 | 0/108 |
| 7 | 0.5 | 0/200 | 0/108 |
| 8 | 0.6 | 0/200 | 0/108 |
| 9 | 0.7 | 0/200 | 0/108 |
| *10 | 0.8 | 0/200 | 4/108 |

*Comparative Example

Referring to Table 2, it can be seen that in samples 1 and 2 in which R/D was less than 0.1, the chipping defects, resulting from damages to the ceramic bodies by crashes between the ceramic bodies or between the ceramic body and other components, occurred.

Further, it can be seen that sample 10, in which R/D was greater than 0.7, toppled over when mounted on the board, resulting in the mounting defect.

Meanwhile, it can be seen that in samples 3 to 8 satisfying the numerical ranges of the present disclosure, the chipping defects resulting from damages to the ceramic bodies by crashes between the ceramic bodies or between the ceramic body and other components did not occur, and even when the multilayer ceramic capacitors having reduced acoustic noise were mounted on the board, they did not topple over and the mounting defects did not occur.

Board Having Multilayer Ceramic Capacitor Mounted Thereon

Figure 5:
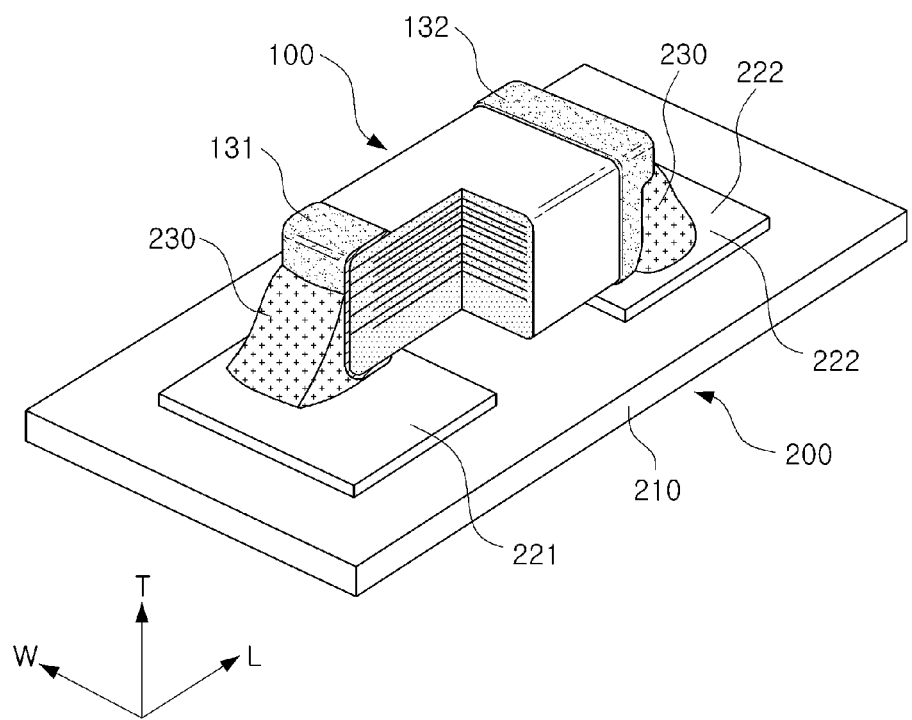
FIG. 5 is a perspective view showing a structure in which the multilayer ceramic capacitor of FIG. 1 is mounted on a printed circuit board.
Figure 6:
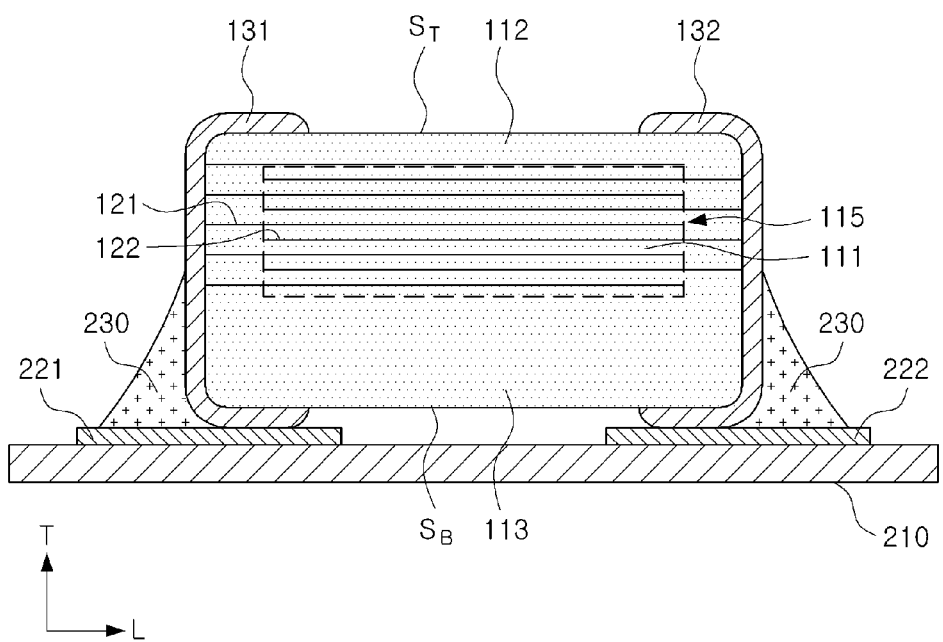
FIG. 6 is a cross-sectional view of the multilayer ceramic capacitor of FIG. 4 mounted on a printed circuit board taken in a length direction.

Referring to FIGS. 5 and 6, a board 200 having the multilayer ceramic capacitor 100 mounted thereon according to an exemplary embodiment of the present disclosure may include a printed circuit board 210 on which the multilayer ceramic capacitor 100 is horizontally mounted and first and second electrode pads 221 and 222 formed on the printed circuit board 210 to be spaced apart from each other.

In this case, the multilayer ceramic capacitor 100 may be electrically connected to the printed circuit board 210 by a solder 230 in a state in which the lower cover layer 113 is disposed to be a lower portion of the capacitor and the first and second external electrodes 131 and 132 are positioned to contact the first and second electrode pads 221 and 222, respectively.

When voltage is applied in a state in which the multilayer ceramic capacitor 100 is mounted on the printed circuit board 210 as described above, acoustic noise may be generated.

Here, sizes of the first and second electrode pads 221 and 222 may become an indicator for determining an amount of the solder 230 connecting the first and second external electrodes 131 and 132 of the multilayer ceramic capacitor 100 to the first and second electrode pads 221 and 222, and a level of the acoustic noise may be controlled according to the amount of the solder 230.

Figure 7:
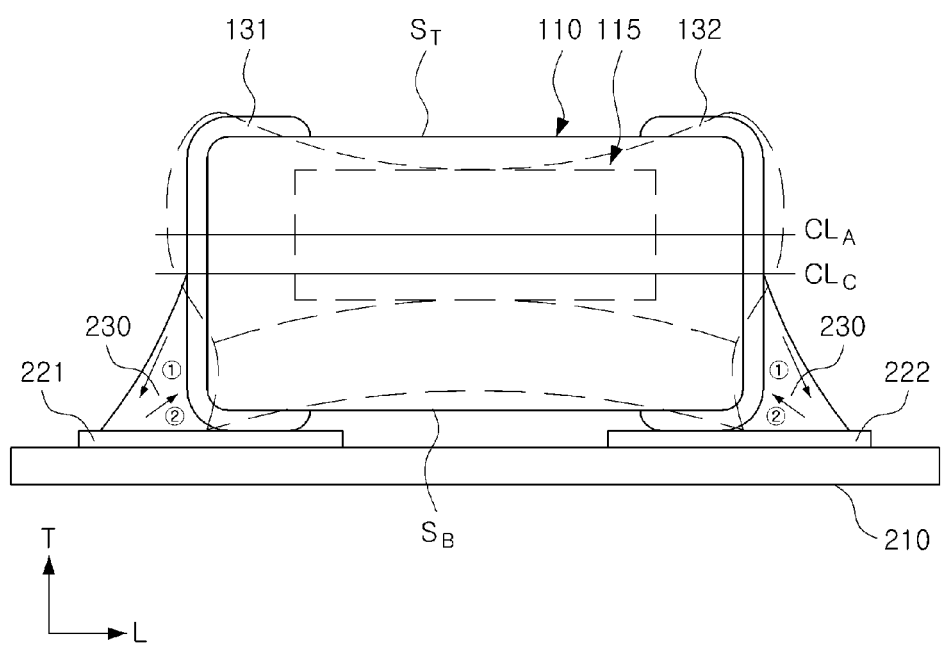
FIG. 7 is a cross-sectional view schematically showing deformation of the multilayer ceramic capacitor of FIG. 4 mounted on a printed circuit board, when voltage is applied thereto.

Referring to FIG. 7, when voltages having different polarities are applied to the first and second electrodes 131 and 132 formed on both end portions of the multilayer ceramic capacitor 100 in a state in which the multilayer ceramic capacitor 100 is mounted on the printed circuit board 210, the ceramic body 110 may be expanded and contracted in the thickness direction by an inverse piezoelectric effect of the dielectric layers 111, and portions of both ends of the ceramic body 110 on which the first and second external electrodes 131 and 132 are formed may be contracted and expanded by the Poisson effect, as opposed to the above-mentioned expansion and contraction of the ceramic body 110 in the thickness direction.

Here, portions of both ends of the ceramic body in the length direction having first and second external electrodes 131 and 132 formed thereon corresponding to the center of the active layer 115 may maximally expand and contract, which is a factor in the generation of acoustic noise.

When both end surfaces of the multilayer ceramic capacitor 100 in the length direction are maximally expanded, outward expansive force (①) is generated at an upper portion of the solder 230 by expansion, and force (②) is generated at a lower portion of the solder 230 to act on the external electrodes due to the outward expansive force created by the expansion.

Therefore, in the case in which points of inflection (PI) formed on both end surfaces of the ceramic body 110 are positioned at a height equal to or below that of the center $CL_c$ of the ceramic body 110 in the thickness direction, due to a difference between a deformation rate occurring in the center $CL_A$ of the active layer 115 and a deformation rate occurring in the lower cover layer 113 when the voltages are applied thereto, the acoustic noise may be further reduced.

As set forth above, according to exemplary embodiments of the present disclosure, vibrations generated in a multilayer ceramic capacitor may be reduced to thereby reduce acoustic noise while the multilayer ceramic capacitor is mounted on a printed circuit board, improve assembly characteristics of the mounting board, and reduce a defect generation rate of the mounting board.

Further, according to exemplary embodiments of the present disclosure, chipping defects, resulting from damages to ceramic bodies by crashes between the ceramic bodies or between the ceramic body and other components, may be prevented, and even when multilayer ceramic capacitors having reduced acoustic noise are mounted on the board, they may not topple over and mounting defects may be prevented.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
a ceramic body in which a plurality of dielectric layers having an average thickness of 0.2 μm to 2.0 μm are stacked;
an active layer including first and second internal electrodes alternately exposed to end surfaces of the ceramic body, at least one of the dielectric layers being interposed between the first and second internal electrodes;
an upper cover layer disposed on the active layer;
a lower cover layer disposed below the active layer and being thicker than the upper cover layer; and
first and second external electrodes covering the end surfaces of the ceramic body,
wherein at least one edge of the upper cover layer is rounded, and
when a radius of curvature of the edge is defined as R and a thickness of the upper cover layer is defined as D, R/D is in a range of 0.1 to 0.7 (0.1≤R/D≤0.7).

2. The multilayer ceramic capacitor of claim 1, wherein when half of a total thickness of the ceramic body is defined as A, a thickness of the lower cover layer is defined as B, and half of a total thickness of the active layer is defined C, a ratio (B+C)/A of deviation between a center of the active layer and a center of the ceramic body is in a range of 1.063 to 1.745 (1.063≤(B+C)/A≤1.745).

3. The multilayer ceramic capacitor of claim 1, wherein when a thickness of the lower cover layer is defined as B and the thickness of the upper cover layer is defined as D, a ratio D/B of the thickness D of the upper cover layer to the thickness B of the lower cover layer is in a range of 0.021 to 0.422 (0.021≤D/B≤0.422).

4. The multilayer ceramic capacitor of claim 1, wherein when half of a total thickness of the ceramic body is defined as A and a thickness of the lower cover layer is defined as B, a ratio B/A of the thickness B of the lower cover layer to the half A of the total thickness of the ceramic body is in a range of 0.329 to 1.522 (0.329≤B/A≤1.522).

5. The multilayer ceramic capacitor of claim 1, wherein when a thickness of the lower cover layer is defined as B and half of a total thickness of the active layer is defined as C, a ratio C/B of the half C of the total thickness of the active layer to the thickness B of the lower cover layer is in a range of 0.146 to 2.458 (0.146≤C/B≤2.458).

6. The multilayer ceramic capacitor of claim 1, wherein points of inflection (PI) formed on the end surfaces of the ceramic body are formed in a position equal to or below a center of the ceramic body in a thickness direction, due to a difference between a deformation rate occurring in a center of the active layer and a deformation rate occurring in the lower cover layer when voltages are applied thereto.

7. The multilayer ceramic capacitor of claim 1, wherein the number of stacked dielectric layers is 150 or greater.

8. A board having a multilayer ceramic capacitor mounted thereon, the board comprising:
a printed circuit board having first and second electrode pads disposed on the printed circuit board; and
the multilayer ceramic capacitor mounted on the printed circuit board,
wherein the multilayer ceramic capacitor includes:
a ceramic body in which a plurality of dielectric layers having an average thickness of 0.2 μm to 2.0 μm are stacked;
an active layer including first and second internal electrodes alternately exposed to end surfaces of the ceramic body, at least one of the dielectric layers being interposed between the first and second internal electrodes;
an upper cover layer disposed on the active layer;
a lower cover layer disposed below the active layer and being thicker than the upper cover layer; and
first and second external electrodes covering the end surfaces of the ceramic body,
at least one edge of the upper cover layer being rounded, and when a radius of curvature of the edge is defined as R and a thickness of the upper cover layer is defined as D, R/D being in a range of 0.1 to 0.7 (0.1≤R/D≤0.7).

9. The board of claim 8, wherein when half of a total thickness of the ceramic body is defined as A, a thickness of the lower cover layer is defined as B, and half of a total thickness of the active layer is defined C, a ratio (B+C)/A of deviation between a center of the active layer and a center of the ceramic body is in a range of 1.063 to 1.745 (1.063≤(B+C)/A≤1.745).

10. The board of claim 8, wherein when a thickness of the lower cover layer is defined as B and the thickness of the upper cover layer is defined as D, a ratio D/B of the thickness D of the upper cover layer to the thickness B of the lower cover layer is in a range of 0.021 to 0.422 (0.021≤D/B≤0.422).

11. The board of claim 8, wherein when half of a total thickness of the ceramic body is defined as A and a thickness of the lower cover layer is defined as B, a ratio B/A of the thickness B of the lower cover layer to the half A of the total thickness of the ceramic body is in a range of 0.329 to 1.522 (0.329≤B/A≤1.522).

12. The board of claim 8, wherein when a thickness of the lower cover layer is defined as B and half of a total thickness of the active layer is defined C, a ratio C/B of the half C of the total thickness of the active layer to the thickness B of the lower cover layer is in a range of 0.146 to 2.458 (0.146≤C/B≤2.458).

13. The board of claim 8, wherein points of inflection (PI) formed on the end surfaces of the ceramic body are formed in a position equal to or below a center of the ceramic body in a thickness direction, due to a difference between a deformation rate occurring in a center of the active layer and a deformation rate occurring in the lower cover layer when voltages are applied thereto.

14. The board of claim 8, wherein the number of stacked dielectric layers is 150 or greater.

* * * * *